United States Patent
Heismann

(10) Patent No.: US 6,524,684 B1
(45) Date of Patent: Feb. 25, 2003

(54) RESISTIVE CURRENT-LIMITING DEVICE WITH AT LEAST ONE PRINTED CONDUCTOR COVERED BY AN INSULATING LAYER BY USING HIGH $T_C$ SUPERCONDUCTIVE MATERIAL

(75) Inventor: Björn Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/857,699

(22) PCT Filed: Nov. 25, 1999

(86) PCT No.: PCT/DE99/03754

§ 371 (c)(1),
(2), (4) Date: Jun. 8, 2001

(87) PCT Pub. No.: WO00/35026

PCT Pub. Date: Jun. 15, 2000

(30) Foreign Application Priority Data

Dec. 8, 1998 (DE) .......................... 198 56 607

(51) Int. Cl.⁷ .................. B23B 15/00; H01L 43/00; H01L 43/10; H01H 47/00
(52) U.S. Cl. ................. 428/209; 505/881; 338/32 S; 361/141
(58) Field of Search ................. 428/209, 210, 428/938, 702, 677; 505/881, 220, 162, 237; 338/32 S, 13, 22 R, 22 SD; 361/19, 58, 141

(56) References Cited

U.S. PATENT DOCUMENTS

| | | | |
|---|---|---|---|
| 3,291,758 A | | 12/1966 | Treaftis |
| 4,961,066 A | * | 10/1990 | Bergsjo et al. ............... 338/20 |
| 5,231,369 A | * | 7/1993 | Preisler et al. ............... 338/20 |
| 5,235,309 A | * | 8/1993 | Preisler et al. ............. 333/17.2 |
| 5,828,291 A | * | 10/1998 | Baumann et al. ......... 338/32 S |
| 5,986,536 A | * | 11/1999 | Ries et al. ..................... 338/13 |

FOREIGN PATENT DOCUMENTS

| | | |
|---|---|---|
| DE | 19520205 A1 | 12/1996 |
| DE | 19634424 A1 | 3/1998 |
| EP | 345767 | 12/1989 |
| EP | 0386473 B1 | 9/1990 |
| EP | 0488275 A2 | 6/1992 |
| EP | 523374 A1 | 1/1993 |
| WO | 9610269 | 4/1996 |
| WO | 9611105 | 4/1996 |

OTHER PUBLICATIONS

Japanese Patent Publication No. 08161983 (Jun. 21, 1996)—Abstract Only.
"Die Kunststoffe und ihre Eigenschaften", H. Domininghaus, 4. Aufl., 1992, VDI–Verlag, p. 51, 3rd to 4th paragraph.
"Die Kunststoffe—Chemie, Physik, Technologie", Kunststoff–Handbuch 1, C. Hauser–Verlag, 1990, p. 723, last paragraph, line 1.
"Ceramic Fiber Flouropolymer Composites For Electronic Packaging Materials", John D. Bolt, *Mat. Res. Soc. Symp. Proc.*, vol. 155, 150–154, 1989.

* cited by examiner

*Primary Examiner*—Tom Dunn
*Assistant Examiner*—Colleen P. Cooke
(74) *Attorney, Agent, or Firm*—Harness, Dickey & Pierce, PLC.

(57) ABSTRACT

A current-limiting device contains at least one conductor track including high $T_c$ superconductor material, on a support body. The conductor track is provided with a cover layer including an insulating plastic material, which includes a filler which increases the thermal conductivity. The thickness of the cover layer is greater than the thickness of the conductor track.

20 Claims, 1 Drawing Sheet

RESISTIVE CURRENT-LIMITING DEVICE WITH AT LEAST ONE PRINTED CONDUCTOR COVERED BY AN INSULATING LAYER BY USING HIGH $T_C$ SUPERCONDUCTIVE MATERIAL

This application is the national phase under 35 U.S.C. §371 of PCT International Application No. PCT/DE99/03754 which has an International filing date of Nov. 25, 1999, which designated the United States of America.

FIELD OF THE INVENTION

The invention relates to a resistive current-limiting device having at least one conductor track, which is designed for a predetermined rated current, contains metal oxide high $T_c$ superconductor material, is arranged on a support body and is provided with a cover layer comprising an at least largely insulating material.

BACKGROUND OF THE INVENTION

In electrical alternating current supply networks, it is impossible to reliably avoid short circuits and electrical spark-overs. In such events, the alternating current in the circuit affected rises very rapidly, i.e. in the first half-wave, to a multiple of its rated value, until it is interrupted by suitable fuse and/or switching device. Consequently, considerable thermal and mechanical loads caused by electrodynamic forces occur in all the affected network components, such as lines and busbars, switches and transformers. Since these brief loads increase proportionally to the square of the current, reliable limiting of the short-circuit current to a lower peak value may considerably reduce the demands imposed on the load-bearing capacity of these network components. In this way, it is possible to achieve cost benefits, for example when constructing new networks and when expanding existing networks, in that it is possible to avoid exchanging network components for designs which can withstand higher loads by incorporating current-limiting devices.

With superconductive current-limiting devices of the resistive type, it is possible, in a manner known per se, to limit the current rise after a short circuit to a value of a low multiple of rated current; furthermore, a limiting device of this type is ready to operate again a short time after switching off. It therefore acts as a rapid, self-restoring fuse. It ensures a high level of operational reliability, since it acts passively, i.e. autonomously, without prior detection of the short circuit and without active triggering by a switching signal.

Resistive super conductive current-limiting devices of the type described in the introduction form a superconductive switching section which is to be connected in series into a circuit. The transition of at least one superconductive conductor track from the virtually resistance-free cold operating state at below the critical temperature $T_c$ of the superconductor material to the normally conductive state above $T_c$ (known as the quench) is utilized, the electrical resistance $R_n$ of the conductor track which is now present limiting the current to an acceptable level of $I=U/R_n$. The heating to above the critical temperature $T_c$ takes place by means of Joule heat in the superconductor of the conductor track itself if, after a short circuit, the current density j rises to above the critical value $j_c$ of the superconductor material, with the material already having adopted a finite electrical resistance even below the critical temperature $T_c$. In the limiting state at above the critical temperature $T_c$, a residual current which has advantageously been reduced flows in the circuit until the circuit has been fully interrupted, for example by means of an additional mechanical disconnect switch.

Superconductive current-limiting devices with known metal oxide high $T_c$ superconductor materials (HTS materials for short), of which the critical temperature $T_c$ is so high that they can be kept in the superconductive operating state using liquid nitrogen ($LN_2$) at 77 K, present a rapid increase in the electrical resistance when the critical current density $j_c$ is exceeded. The heating to the normally conductive state and therefore the current limiting take place within a sufficiently short time for it to be possible to limit the peak value of a short-circuit current to a fraction of the unlimited current, for example 3 to 10 times the rated current. The superconductive current path should be in thermally conductive contact with a coolant which is able to restore it to the superconductive operating state within a relatively short time of the critical current density $j_c$ being exceeded.

Corresponding demands can be largely fulfilled using the current-limiting device which is described in DE-19520205 A1. The known current-limiting device has a support body comprising an electrical insulating material, such as for example Y-stabilized $ZrO_2$ or glass, to which a metal oxide HTS material in the form of a layer structured with at least one conductor track is applied directly or via an intermediate layer. The conductor track may be designed in particular in meandering form (cf. EP 0 523 374 A1). At its ends, the conductor track can make contact with further conductors for feeding in or tapping off the current which is to be limited. Furthermore, in the known current-limiting device, to protect its HTS material against environmental influences such as moisture, it is possible for at least the superconductor material also to be covered with an insulating layer.

Embodiments of current-limiting devices using HTS material in which the conductor tracks are covered with normally conductive material, which serve as shunt resistors, are known (cf. EP 0 345 767 A1).

With current-limiting devices of this type, one technical problem is the dissipation of the thermal energy which is locally deposited in the superconductor and/or metal layers during a switching process: the support body which bears the conductor track in this case serves as the principal heat accumulator during the switching phase, while the heat transfer from the material of the conductor track to a reservoir of the coolant, such as in particular $LN_2$, is low and, moreover, deteriorates further as a result of a film of gas being formed at the surface. It has also been found that, in the first switching phase, prior to the significant onset of thermal diffusion, temperature gradients of more than 100 K/mm are formed between conductor track regions which are still in the superconductive state and regions which have already switched and therefore are being heated from the coolant temperature to a higher temperature level. In this case, the temperature gradients which the layer system of the conductor tracks can locally tolerate ultimately constitute the material-specific limit for a maximum electrical power which is to be switched.

Furthermore, liquid nitrogen ($LN_2$) or the nitrogen gas film which forms as a result of the heating additionally has a dielectric strength which is significantly lower than that of a solid and is of particular significance when used with an increasing switching capacity while at the same time optimizing the utilization of area by minimizing the spaces between individual conductor track parts, for example in a meandering form.

In view of the cooling technology problems outlined above, it has hitherto been necessary to restrict the switching capacity of current-limiting devices of this type to a relatively low value.

SUMMARY OF THE INVENTION

Therefore, it is an object of the present invention to design the current-limiting device with the features described in the field of the invention introduction, in such a way that it can be used for relatively high switching capacities.

According to the invention, this and other objects are achieved by the fact that the material of the cover layer is a plastic having at least one filler which increases the thermal conductivity, and at least that part of the cover layer which is associated with the surface of the at least one conductor track has a thickness which is greater than the thickness of the conductor track.

The advantages associated with this design of the current-limiting device are in particular that the extent of temperature gradients in the conductor track is reduced, thereby affecting spatial homogenization of the phase transition. Furthermore, the cover layer which is situated on the front side and if appropriate also on the back side of the structure of the current-limiting device overall, imparts greater mechanical stability to the structure. Furthermore, by suitably selecting the plastic and filler materials, it is possible to ensure a sufficiently high dielectric strength.

This is because a cover layer of this type, which acts as an insulating solid body, during the switching operation functions as an additional heat buffer for the thermal energy which has been deposited in the conductor track. Moreover, compared to a liquid and, in particular, gaseous, turbulently flowing coolant, such as $LN_2$, filled plastic materials have significantly better coefficients of thermal conductivity, heat storage and heat transfer. Moreover, they have the high mechanical stability which has already been mentioned. On account of the improved dissipation of heat out of the conductor track into the applied buffer comprising the cover layer material, local regions of the conductor tracks are heated to a lesser extent during the first millisecond of the switching operation; i.e. the temperature gradients are reduced accordingly. Therefore, the local resistance is lower and the greater current rise is utilized to switch track regions with a higher $j_c$ at an earlier time and with lower nominal voltages applying into the resistive state. As a result, the resistance required for current limiting is generated to an increased extent by the increase in switching area the through material. Therefore, the thermal and mechanical loads on the layer system are reduced.

Insulating materials which cure at room temperature or at an elevated temperature and are provided with the filler are advantageously selected as the cover-layer material. In particular, these insulating materials are preferably synthetic resins based on epoxy resin. Materials of this type can be applied relatively easily and without pores to the surface of the conductor track or the structure comprising conductor track and support body, and can be cured there.

The proportion of filler material in the plastic material is advantageously selected to be between 5 and 60% by volume, if electrically conductive filler material is provided. If electrically nonconductive filler material is being used, the filler may form up to 80% by volume. In this way, it is possible to ensure not only a sufficient mechanical stability of the structure comprising cover layer and conductor track below it, but also particularly good dissipation of heat.

The filler materials provided are advantageously at least one material selected from the group consisting of Cu, Ag, Al, their alloys, metal oxides, in particular $Al_2O_3$ or $Y_2O_3$ or CuO. With these materials, it is possible to achieve a particularly good dissipation of heat to the cryogenic coolant. With a view to achieving a sufficient dielectric strength, filler materials comprising electrically nonconductive material are particularly suitable.

In general, the mean thickness of the cover layer should be between 10 $\mu$m and 1 mm. This firstly allows sufficient cooling of the superconductive conductor track; secondly, sufficient account is also taken of the mechanical stability.

The selection of material for the cover layer and in particular for the fillers is advantageously selected in such a way that a dielectric strength of the cover layer at the operating temperature of the superconductor material of at least 15 kV/mm, preferably at least 20 kV/mm, is observed. Dielectric strength of this level can readily be achieved using conventional filler materials and plastic materials.

Further advantageous configurations of the current-limiting device according to the invention are given in the remaining dependent claims.

BRIEF DESCRIPTION OF THE DRAWINGS

To further explain the invention, reference is made to the drawing, in which, in each case diagrammatically.

DETAILED DESCRIPTION OF THE PREFERRED EMBODIMENTS

Figure 1:
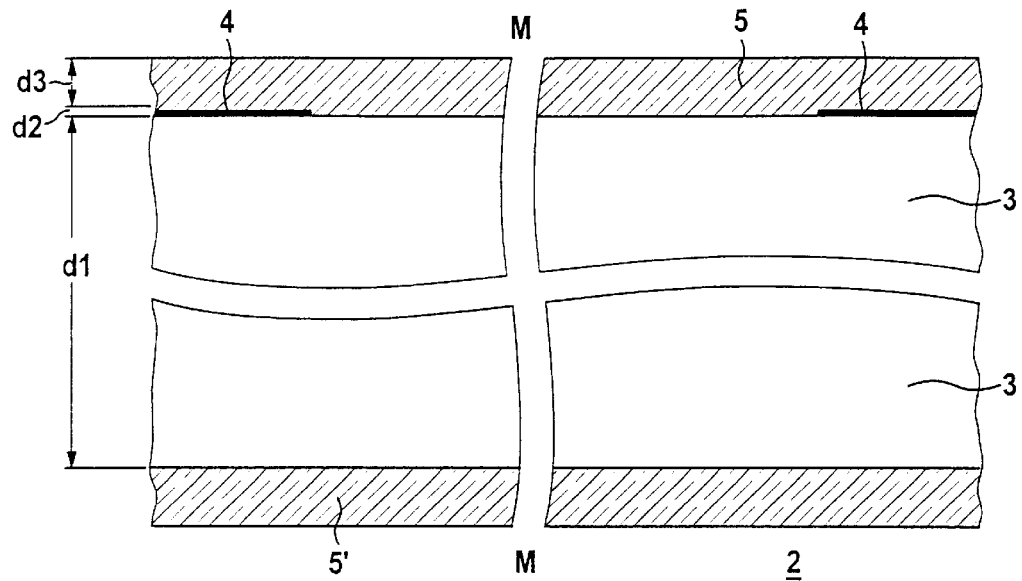
FIG. 1 shows a cross section through a current-limiting device according to the invention.

In the specific design of the current-limiting device according to the invention, embodiments which are known per se are used as the starting point (cf. DE 195 20 205 A1 or EP 0 523 374 A1). The current-limiting device therefore comprises at least one support body, which is also known as a substrate, if appropriate at least one intermediate layer which is deposited on the support body and is to be regarded as a buffer or adhesion layer, and at least one layer of a HTS material which is applied to this intermediate layer. A plate or strip or other structure comprising a metallic or electrically insulating material of any desired thickness and the dimensions which are appropriate for the particular application is used for the support body. Suitable metallic materials in this context are all elemental metals which are known as supports for HTS materials or alloys of these metals. By way of example, Cu, Al or Ag or their alloys, with one of the elements as the principal component, or steels, such as special NiMo alloys (e.g. "Hastelloy") are suitable. Supports of this type generally have to be covered with an insulation layer with respect to the HTS material. Suitable nonmetallic, electrically insulating materials for the support body are ceramics, such as Y-stabilized $ZrO_2$ (abbreviation: "YSZ"), MgO, $SrTiO_3$ or, in particular, glass materials. The intermediate layer may in particular be selected so as to promote textured growth of the HTS material. Therefore, by way of example, YSZ, $CeO_2$, YSZ+$CeO_2$ (as a double layer), $Pr_6O_{11}$, MgO, Y+SN-doped $In_2O_3$ (as a double layer), $SrTiO_3$ or $La_{1-x}Ca_xMnO_3$ are suitable as the intermediate layer material.

Suitable HTS materials are all known metal oxide high $T_c$ superconductor materials which allow in particular cooling with liquid nitrogen ($LN_2$). Examples of suitable materials are $YBa_2Cu_3O_{7-x}$ or $RBa_2Cu_3O_{7-x}$ (where R=rare earth), $HgBa_2CaCu_2O_{6+x}$, $HgBa_2Ca_2Cu_3O_{8+x}$, $Bi_2Sr_2CaCu_2O_{8+x}$ or $(Bi, Pb)_2Sr_2Ca_2Cu_3O_{10+x}$. These materials only represent basic types; therefore, some of their components may be at least partially replaced, in a manner which is known per se, by other suitable components. The HTS layer formed from this material is structured to form the at least one conductor track. The layer or structure comprising the HTS material may moreover be provided with at least one electrically conductive layer of metal which serves as a shunt resistor. Suitable shunt resistor materials are those which do not undergo undesirable reactions with the HTS material. Examples of suitable materials are Ag and Au and their alloys with further alloying partners. Furthermore, the conductor track, which if appropriate has a metallic shunt resistor layer of this type, is to be covered with at least one special, at least largely electrically insulating covering layer made from a plastic material and with a sufficient thickness. The thickness of the cover layer should be greater than that of the conductor track in the corresponding surface region, preferably at least three times as great. This covering does not need to be present only in the region of the conductor track. Rather, it may also extend over the entire surface of the structure of the current-limiting device on one or both sides.

FIG. 1 shows a corresponding structure of a current-limiting device or a part of this device. This current-limiting device, which is denoted overall by 2, therefore includes a support body 3 of thickness d1, an optional thin intermediate layer or buffer layer which may be arranged thereon but is not included in the figure, and at least one conductor track 4 which is arranged thereon and is formed from a HTS layer of thickness d2. At its ends, this conductor track is provided with contact faces (not shown), to which further conductors for feeding in and tapping off a current which is to be limited are to be connected. An insulating cover layer which is deposited on the conductor track at least in the region of this track is denoted by 5 and has a thickness d3 (in the region of the conductor track). As shown in the figure, this cover layer may also cover the entire structure. As can also be seen from the figure, it is also possible for the rear side of the structure to be provided with a corresponding cover layer 5'. Embedding the support body in this way has scarcely any effect on the switching phase; the measure serves primarily to provide further mechanical stability. The current-limiting device 2 or its at least one conductor track 4 is kept at the cryogenic operating temperature by a coolant M, such as $LN_2$.

According to the invention, the cover layer 5 (and if appropriate 5') includes an insulating plastic material. The insulating plastic material is filled in particular with at least 5% by volume of a filler material. Suitable insulating plastic materials are in particular plastics which cure at room temperature or at higher temperatures and are also used as single-component or multicomponent adhesives, such as for example epoxy resins. Suitable epoxy resins are known, for example, by the trade names "Stycast 2850 FT blue/black", produced by W. R. Grace & Co., Conn., New York (US) or "Uhu plus endfest 300", produced by Uhu GmbH, Bühl (DE). Further examples of suitable plastic materials are described in EP 0 488 275 A2 or U.S. Pat. No. 3,291,758 A. These plastic materials should moreover be filled with at least one filler, which increases the thermal conductivity, comprising an electrically conductive or in particular electrically nonconductive material. For reasons of achieving a high dielectric strength, electrically nonconductive filler materials are preferred. The proportion of these materials is generally between 5 and 80% by volume. $Al_2O_3$ is particularly advantageous, on account of its good thermal conductivity (cf. for example EP 0 386 473 B1). When using electrically conductive filler materials, the maximum content of these materials is generally lower in relative terms, in particular between 5 and 60% by volume. Examples of filler materials of this type are Cu, Al or Ag and their alloys. In addition to the electrically nonconductive filler material $Al_2O_3$ which has been mentioned above, for example in the form of sapphire, suitable examples include in particular other metal oxides, such as $Y_2O_3$ or CuO. The thickness d3 of the cover layer 5 or 5', at least in the region of the surface of the associated conductor track 4, should be selected in such a way that it is greater than the thickness d1 of the conductor track below, preferably is at least three times as great.

According to a specific exemplary embodiment, a HTS conductor track comprising $YBa_2Cu_3O_{7-x}$ with a thickness d2=1 μm is applied to a support body 3 comprising an aluminosilicate glass material with a thickness d1=0.4 mm. Both sides of this structure are provided with a covering layer 5 and 5' comprising "Uhu plus endfest 300" with a 10% Cu powder filling and a thickness of 10 μm. The dielectric strength of this layer is approximately 20 kV/mm.

Figure 2:
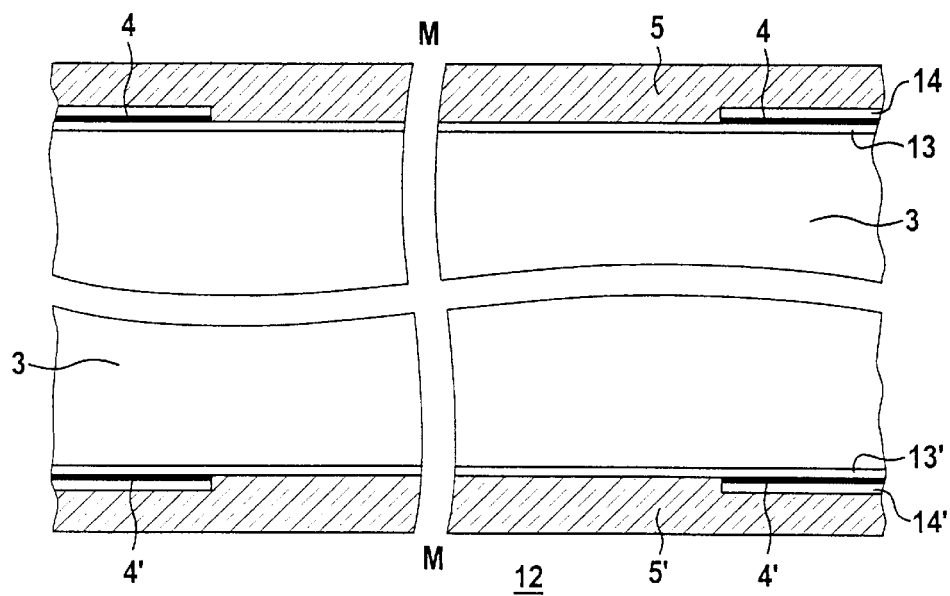
FIG. 2 shows an excerpt of a further embodiment of a current-limiting device of this type.

FIG. 2 shows an excerpt of a further embodiment of a current-limiting device 12 according to the invention, the support body 3 of which is provided with HTS conductor tracks 4 and 4' on both sides. Corresponding embodiments are known in principle (cf. for example WO 96/10269). The support body once again comprises, for example, a special glass material which is coated on both sides with a thin buffer layer 13 or 13', respectively, of YSZ, this layer being, for example, 0.3 μm thick. On each of these buffer layers there is a conductor track 4 or 4', respectively, comprising a HTS material, such as for example $Bi_2Sr_2CaCu_2O_{8+x}$. These conductor tracks are each covered by a thin shunt resistor layer 14 or 14', respectively, comprising a normally conductive material, such as for example Au or Ag, this layer being, for example, 0.5 μm thick. Both sides of this structure are covered with a cover layer 5 or 5', respectively, comprising the special insulating plastic material with fillers, this layer being, for example, 10 μm thick.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A resistive current-limiting device, comprising:
   at least one conductor track including metal oxide high $T_C$ superconductor material;
   a support body, on which the at least one conductor track is arranged; and
   a cover layer including an at least largely insulating material, wherein the material of the cover layer is a plastic material including at least one filler which relatively increases thermal conductivity, and wherein at least that part of the cover layer associated with a surface of the at least one conductor track has a thickness which is relatively greater than the thickness of the at least one conductor track.

2. The device as claimed in claim 1, wherein a thickness of the cover layer is at least three times as great as the thickness of the associated conductor track.

3. The device as claimed in claim 1, wherein the cover-layer material is a curing, filled insulating material.

4. The device as claimed in claim 1, wherein the plastic material includes a synthetic resin.

5. The device as claimed in claim 1, wherein the filler material includes a material selected from the group consisting of Cu, Ag, Al, their alloys, and metal oxides.

6. The device as claimed in claim 1, wherein the filler material content in the plastic material is between 5 and 60% by volume when using an electrically conductive filler material and between 5 and 80% by volume when using an electrically nonconductive filler material.

7. The device as claimed in claim 1, wherein a mean thickness of the cover layer is between 10 $\mu$m and 1 mm.

8. The device as claimed in claim 1, wherein a dielectric strength of the cover layer at the operating temperature of the superconductor material is at least 15 kV/mm.

9. The device as claimed in claim 1, wherein the cover layers include the filled plastic material on both sides of a structure including a support body and at least one conductor track.

10. The device as claimed in claim 2, wherein the cover-layer material is a curing, filled insulating material.

11. The device as claimed in claim 2, wherein the plastic material includes a synthetic resin.

12. The device as claimed in claim 2, wherein the filler material includes a material selected from the group consisting of Cu, Ag, Al, their alloys, and metal oxides.

13. The device of claim 5, wherein the metal oxides include $Al_2O_3$, $Y_2O_3$ and CuO.

14. The device as claimed in claim 2 wherein the filler material content in the plastic material is between 5 and 60% by volume when using an electrically conductive filler material and between 5 and 80% by volume when using an electrically nonconductive filler material.

15. The device as claimed in claim 2, wherein a mean thickness of the cover layer is between 10 $\mu$m and 1 mm.

16. The device as claimed in claim 2, wherein a dielectric strength of the cover layer at the operating temperature of the superconductor material is at least 15 kV/mm.

17. The device as claimed in claim 2, wherein the cover layers include the filled plastic material on both sides of a structure including a support body and at least one conductor track.

18. The device of claim 12, wherein the metal oxides include $Al_2O_3$, $Y_2O_3$ and CuO.

19. The device as claimed in claim 8, wherein the dielectric strength of the cover layer at the operating temperature of the superconductor material is at least 20 kV/mm.

20. The device as claimed in claim 16, wherein the dielectric strength of the cover layer at the operating temperature of the superconductor material is at least 20 kV/mm.

* * * * *